(12) United States Patent
Nakamura

(10) Patent No.: US 8,178,903 B2
(45) Date of Patent: May 15, 2012

(54) SEMICONDUCTOR DEVICE

(75) Inventor: Hideyuki Nakamura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 438 days.

(21) Appl. No.: 12/573,936

(22) Filed: Oct. 6, 2009

(65) Prior Publication Data

US 2010/0084689 A1    Apr. 8, 2010

(30) Foreign Application Priority Data

Oct. 6, 2008 (JP) .................................. 2008-259458

(51) Int. Cl.
*H01L 27/092* (2006.01)
(52) U.S. Cl. .................. 257/206; 257/E27.067; 365/165
(58) Field of Classification Search .................. 257/202, 257/206, 369, E27.067; 365/164, 165
See application file for complete search history.

(56) References Cited

FOREIGN PATENT DOCUMENTS
WO    2006-016403    2/2006

OTHER PUBLICATIONS

T. Calin et al.—Upset Hardened Memory Design for Submicron CMOS Technology—IEEE Transactions on Nuclear Science, vol. 43, No. 6, Dec. 1996—pp. 1-5.

*Primary Examiner* — Benjamin Sandvik
*Assistant Examiner* — Whitney T Moore
(74) *Attorney, Agent, or Firm* — Young & Thompson

(57) ABSTRACT

A semiconductor device in accordance with an exemplary aspect of the present invention includes: an even number of transistor pairs; connection nodes connecting the n-type transistors and the p-type transistors of the transistor pairs; and inter-gate wiring lines connected to the connection nodes, each inter-gate wiring line connecting a gate of the p-type transistor of one of the transistor pairs disposed in the subsequent stage of one of the transistor pairs for which each connection node is provided, wherein the n-type transistor of a first transistor pair is disposed in a p-well region different from both a p-well region in which the n-type transistor of a second transistor pair disposed in two stages preceding of the first transistor pair is disposed and a p-well region in which the n-type transistor of a third transistor pair disposed in two stages subsequent of the first transistor pair is disposed.

9 Claims, 9 Drawing Sheets

SEMICONDUCTOR DEVICE

BACKGROUND

1. Field of the Invention

The present invention relates to a semiconductor device and, in particular, to a semiconductor device including a state storage circuit including redundant storage nodes.

2. Description of Related Art

In recent years, semiconductor miniaturization technology has been advanced and there has been a trend toward smaller transistor sizes. However, if a transistor of a small size is used, the amount of charge held by the drain of one transistor is reduced. For this reason, a soft error caused when radiation enters a semiconductor device has been a significant problem. A soft error refers to an error where when radiation enters the vicinity of the drain of a transistor constituting a storage node of a state storage circuit, such as a memory or a latch circuit, electrons or holes occur and data held by the storage node is lost due to the electrons.

Among examples of a circuit for enhancing resistance to such a soft error is a DICE (dual interlocked cell) circuit where circuits constituting storage nodes are made redundant to prevent loss of data held by the storage nodes. Examples of such a DICE circuit are disclosed in Japanese Patent Translation Publication No. WO/2006/016403 and T. Calin, et al., "Upset Hardened Memory Design for Submicron CMOS Technology," IEEE TRANSACTIONS ON NUCLEAR SCIENCE, Vol. 43, No. 6, pp. 2874-2878, Dec. 1996.

FIG. 8 shows a circuit diagram of a DICE circuit 100 described in WO/2006/016403. As shown in FIG. 8, the DICE circuit 100 basically includes four transistor pairs each including a p-type MOS transistor and an n-type MOS transistor. In FIG. 8, a pair formed by a p-type transistor 121a and an n-type transistor 122a, which is a first transistor pair, and a pair formed by a p-type transistor 121b and an n-type transistor 122b, which is a third transistor pair, are transistor pairs that make each other redundant. Likewise, a pair formed by transistors 126a and 127a, which is a second transistor pair, and a pair formed by transistors 126b and 127b, which is a fourth transistor pair, are transistor pairs that make each other redundant.

For example, a node C1 connecting the transistors 121a and 122a of the first transistor pair is connected to the gate of the p-type transistor 126a and the gate of the n-type transistor 127b. Also, the node C1 is connected to a bit line BLa via a transistor 123a. A word line WLa is connected to the gate of the transistor 123a.

A node C2 connecting the p-type transistor 126a and the n-type transistor 127a of the second transistor pair is connected to the gate of the p-type transistor 121b and the gate of the n-type transistor 122a. Also, the node C2 is connected to a bit line BLXa via a transistor 128a. The gate of the transistor 128a is connected to a word line WLa.

Similar connections are made with respect to a node C3 of the third transistor pair and a node C4 of the fourth transistor pair. Wiring lines connecting the nodes C1 to C4 and the gates of the transistors as described above correspond to node-gate connecting means.

As seen, in the DICE circuit 100, the first and third transistor pairs make each other redundant and the second and fourth transistor pairs make each other redundant. The node connecting the p-type transistor and n-type transistor of each transistor pair is connected to the gate of the p-type transistor of the transistor pair disposed in the subsequent stage and to the gate of the n-type transistor of the transistor pair disposed in the preceding stage. By having such a configuration, even if charge exceeding a critical charge amount occurs at one node when radiation enters, the error state does not easily spread over the node in the subsequent stage nor the node in the preceding stage. Thus, the soft error tolerance is enhanced.

FIG. 9 shows an example of the layout of the DICE circuit 100. In FIG. 9, as in FIG. 8, two n-wells are disposed on both sides of a centrally disposed p-well, and two p-wells are disposed outside the n-wells. The n-type transistors 122a and 127a are disposed in the central p-well. The p-type transistors 121b and 126b are disposed in the right-hand n-well region. The p-type transistors 121a and 126a are disposed in the left-hand n-well region. The n-type transistor 122b is disposed in the most right-hand p-well. The n-type transistor 127b is disposed in the most left-hand p-well.

That is, in the DICE circuit 100, the transistors constituting the nodes C1 and C3 are disposed in the separated wells, and the transistors constituting the nodes C2 and C4 are disposed in the separated wells. Thus, the nodes C1 and C3 holding an identical logic level avoid becoming simultaneously affected by charge caused when radiation enters these nodes. The same holds true for the nodes C2 and C4 holding an identical logic level. Thus, the soft error tolerance is further enhanced.

SUMMARY

However, the present inventor has found that, with regard to the DICE circuit 100, the n-type transistors constituting the storage nodes holding an identical logic level are disposed in the separated well regions, the p-type transistors constituting such storage nodes are also disposed in the separated well regions, and thus the layout area efficiency deteriorates. Particularly in a standard cell, transistors must be disposed in predetermined well regions. Therefore, if the number of wells in which transistors are disposed is increased, the layout area efficiency further deteriorates.

A first exemplary aspect of the present invention is a semiconductor device comprising: an even number of transistor pairs, each transistor pair being a transistor pair in which an n-type transistor and a p-type transistor are connected in series between a power supply terminal and a ground terminal, the even number being a four or more; connection nodes connecting the n-type transistors and the p-type transistors of the transistor pairs; and inter-gate wiring lines connected to the connection nodes, each inter-gate wiring line connecting a gate of the n-type transistor of one of the transistor pairs disposed in the preceding stage of one of the transistor pairs for which each connection node is provided and a gate of the p-type transistor of one of the transistor pairs disposed in the subsequent stage of one of the transistor pairs for which each connection node is provided, wherein the even number of transistor pairs constitute a state storage circuit in such a manner that the transistor pairs are connected in the form of a loop, and any one of the transistor pairs is referred to as a first transistor pair, the n-type transistor of the first transistor pair is disposed in a p-well region different from both a p-well region in which the n-type transistor of a second transistor pair disposed in two stages preceding of the first transistor pair is disposed and a p-well region in which the n-type transistor of a third transistor pair disposed in two stages subsequent of the first transistor pair is disposed.

According to a semiconductor device according to an exemplary aspect of the present invention, p-type transistors, which are disposed in separated n-well regions in the related art, are disposed in an identical n-well region. Thus, in the semiconductor device according to the aspect of the present invention, the number of well regions used to constitute a state storage circuit is reduced.

By adopting the semiconductor device according to the exemplary aspect of the present invention, the soft error tolerance is enhanced and the layout efficiency of the state storage circuits is increased.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Now, a first embodiment of the present invention will be described with reference to the accompanying drawings. A semiconductor device according to this exemplary embodiment includes a state storage circuit where storage nodes make each other redundant. A key feature of this exemplary embodiment is how the elements of the state storage circuit are disposed. Also the semiconductor device according to this exemplary embodiment uses a DICE circuit as an example of the state storage circuit. Also, in the semiconductor device according to this exemplary embodiment, the state storage circuit is disposed as a standard cell. A standard cell refers to a circuit component that is designed so that power supply wiring lines and grounding wiring lines are disposed in areas arranged at predetermined intervals in advance and that has a height corresponding to the wiring intervals and an arbitrary width. In a standard cell, n-well regions and p-well regions are necessarily formed along power supply wiring lines and ground wiring lines.

Figure 1:
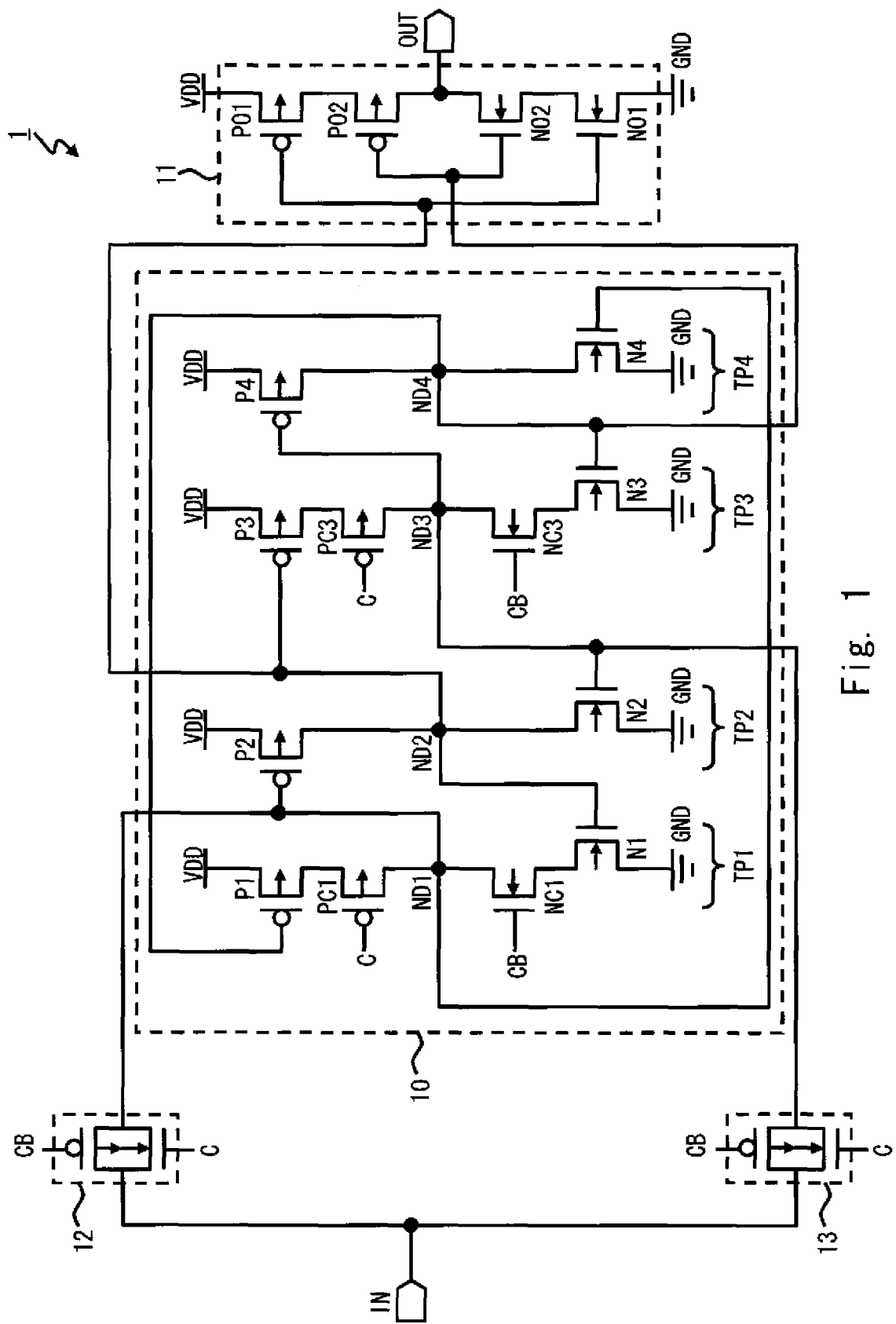
FIG. 1 is a block diagram of a state storage circuit in accordance with a first exemplary embodiment of the present invention.

FIG. 1 shows a circuit diagram of a latch circuit 1 according to this exemplary embodiment. As shown in FIG. 1, the latch circuit 1 includes an input terminal IN, an output terminal OUT, a state storage circuit (e.g., DICE circuit 10), an output circuit 11, and transfer switches 12 and 13.

The transfer switches 12 and 13 are provided between the input terminal IN and DICE circuit 10. These transfer switches provide input signals input to the input terminal IN, to the DICE circuit 10. The transfer switches 12 and 13 each include an n-type transistor (e.g., NMOS transistor) and a p-type transistor (e.g., PMOS transistor). In each transfer switch, the source of the NMOS transistor and the source of the PMOS transistor are connected to each other, and the drain of the NMOS transistor and the drain of the PMOS transistor are connected to each other. Also, the source of each transfer switch is connected to the input terminal IN, and the drain thereof is connected to the DICE circuit 10. Also, at each transfer switch, control signals having opposite logic levels are provided to the gate of the NMOS transistor and the gate of the PMOS transistor. In an example shown in FIG. 1, a control signal C is provided to the gate of the NMOS transistor, and a control signal CB is provided to the gate of the PMOS transistor.

The DICE circuit 10 includes an even number of transistor pairs (in this exemplary embodiment, transistor pairs TP1 to TP4). The transistor pairs TP1 to TP4 each include NMOS transistors and PMOS transistors connected in series between a power supply terminal VDD and a ground terminal GND. Also, the transistor pairs TP1 to TP4 include connection nodes ND1 to ND4, respectively, which each connects the drain of the corresponding NMOS transistor and the drain of the corresponding PMOS transistor. The transistor pairs are connected to one another via inter-gate wiring lines that are connected to the connection nodes and that connect the gate of the NMOS transistor of the transistor pair disposed in the preceding stage each transistor pair and the gate of the PMOS transistor of the transistor pair disposed in the subsequent stage each transistor pair. By connecting the transistor pairs using the inter-gate wiring lines, the transistor pairs are connected in the form of a loop.

In a typical DICE circuit, a first transistor pair is made redundant using a second transistor and a third transistor pair; in the DICE circuit 10, four transistor pairs are provided and therefore the second transistor pair and third transistor pair are an identical transistor pair. More specifically, in the DICE circuit 10, the transistor pair TR1 (e.g., first transistor pair) is made redundant using the transistor pair TR3 (e.g., second and third transistor pairs) and the transistor pair TR2 (first transistor pair) is made redundant using the transistor pair TR4 (e.g., second and third transistor pairs). In the DICE circuit 10, such redundancy increases the soft error tolerance of data held by each connection node.

The transistor pair TP1 includes an NMOS transistor N1, a PMOS transistor P1, a PMOS transistor PC1 for control, and an NMOS transistor NC1 for control. The drain of the PMOS transistor P1 is connected to the power supply terminal VDD, and the source thereof is connected to the source of the PMOS transistor PC1 for control. The gate of the PMOS transistor P1 is connected to the connection node ND4 of the transistor pair TP4 disposed at the preceding stage of the transistor pair TP1 and to the gate of the NMOS transistor N3 of the transistor pair TP3 disposed at the preceding stage of the transistor pair TP4 via the corresponding inter-gate wiring line. The drain of the PMOS transistor PC1 for control is connected to the drain of the NMOS transistor NC1 for control via the connection node ND1. The control signal C is input into the gate of the PMOS transistor PC1 for control. The control signal CB having a logic level opposite to that of the control signal C is input into the gate of the NMOS transistor NC1 for control. The source of the NMOS transistor NC1 for control is connected to the drain of the NMOS transistor N1. The source of the NMOS transistor N1 is connected to the ground terminal GND. The gate of the NMOS transistor N1 is connected to the connection node ND2 of the transistor pair TP2 disposed at the subsequent stage of the transistor pair TP1 and to the gate of the PMOS transistor P3 of the transistor pair TP3 disposed at the subsequent stage of the transistor pair TP2 via the corresponding inter-gate wiring line. Note that the PMOS transistor PC1 for control and NMOS transistor NC1 for control may be omitted. When doing so, the drain of the PMOS transistor P1 and the drain of the NMOS transistor N1 are directly connected to each other via the connection node ND1.

The transistor pair TP2 includes an NMOS transistor N2 and a PMOS transistor P2. The drain of the PMOS transistor P2 is connected to the power supply terminal VDD, and the source thereof is connected to the drain of the NMOS transistor N2. The gate of the PMOS transistor P2 is connected to the connection node ND1 of the transistor pair TP1 disposed at the preceding stage of the transistor pair TP2 and to the gate of an NMOS transistor N4 of the transistor pair TP4 disposed at the preceding stage of the transistor pair TP1 via the corresponding inter-gate wiring line. An input signal is provided to the gate of the PMOS transistor P2 via the transfer switch 12. The source of the NMOS transistor N2 is connected to the ground terminal GND. The gate of the NMOS transistor N2 is connected to the connection node ND3 of the transistor pair TP3 disposed at the subsequent stage of the transistor pair TP2 and to the gate of a PMOS transistor P4 of the transistor pair TP4 disposed at the subsequent stage of the transistor pair TP3 via the corresponding inter-gate wiring line. An input signal is provided to the gate of the NMOS transistor N2 via the transfer switch 13. Also, the connection node ND 2 of the transistor pair TP2 is connected to the output circuit 11.

The transistor pair TP3 includes an NMOS transistor N3, a PMOS transistor P3, a PMOS transistor PC3 for control, and an NMOS transistor NC3 for control. The drain of the PMOS transistor P3 is connected to the power supply terminal VDD, and the source thereof is connected to the source of the PMOS transistor PC3 for control. The gate of the PMOS transistor P3 is connected to the connection node ND2 of the transistor pair TP2 disposed at the preceding stage of the transistor pair TP3 and to the gate of the NMOS transistor N1 of the transistor pair TP1 disposed at the preceding stage of the transistor pair TP2 via the corresponding inter-gate wiring line. The drain of the PMOS transistor PC3 for control is connected to the drain of the NMOS transistor NC3 for control via the connection node ND3. The control signal C is input into the gate of the PMOS transistor PC3 for control. The control signal CB having a logic level opposite to that of the control signal C is input into the gate of the NMOS transistor NC3 for control. The source of the NMOS transistor NC3 for control is connected to the drain of the NMOS transistor N3. The source of the NMOS transistor N3 is connected to the ground terminal GND. The gate of the NMOS transistor N3 is connected to the connection node N4 of the transistor pair TP4 disposed at the subsequent stage of the transistor pair TP3 and to the gate of the PMOS transistor P1 of the transistor pair TP1 disposed at the subsequent stage of the transistor pair TP4 via the corresponding inter-gate wiring line. Note that the PMOS transistor PC3 for control and NMOS transistor NC3 for control may be omitted. When doing so, the drain of the PMOS transistor P3 and the drain of the NMOS transistor N3 are directly connected to each other via the connection node ND3.

The transistor pair TP4 includes the NMOS transistor N4 and PMOS transistor P4. The drain of the PMOS transistor P4 is connected to the power supply terminal VDD, and the source thereof is connected to the drain of the NMOS transistor N4. The gate of the PMOS transistor P4 is connected to the connection node ND3 of the transistor pair TP3 disposed at the preceding stage of the transistor pair TP4 and to the gate of the NMOS transistor N2 of the transistor pair TP2 disposed at the preceding stage of the transistor pair TP3 via the corresponding inter-gate wiring line. The source of the NMOS transistor N4 is connected to the ground terminal GND. The gate of the NMOS transistor N4 is connected to the connection node ND1 of the transistor pair TP1 disposed at the subsequent stage of the transistor pair TP4 and to the gate of the PMOS transistor P2 of the transistor pair TP2 disposed at the subsequent stage of the transistor pair TP1 via the corresponding inter-gate wiring line. Also, the connection node ND 4 of the transistor pair TP4 is connected to the output circuit 11.

The output circuit 11 includes NMOS transistors NO1 and NO2 and PMOS transistors PO1 and PO2. The drain of the PMOS transistor PO1 is connected to a power supply terminal VDD, and the source thereof is connected to the source of the PMOS transistor PO2. The drain of the PMOS transistor PO2 is connected to the drain of the NMOS transistor NO2. The source of the NMOS transistor NO2 is connected to the drain of the NMOS transistor NO1. The source of the NMOS transistor NO1 is connected to a ground terminal GND. A node connecting the drain of the PMOS transistor PO2 and the drain of the NMOS transistor NO2 is connected to the output terminal OUT. Also, in the output circuit 11, the gate of the PMOS transistor PO1 and the gate of the NMOS transistor NO1 are connected to each other and then connected to the connection node ND2. On the other hand, the gate of the PMOS transistor PO2 and the gate of the NMOS transistor NO2 are connected to each other and then connected to the connection node ND4.

In the latch circuit 1 described above, the connection node ND1 and connection node ND3 of the DICE circuit 10 have an identical logic level and the connection node ND2 and connection node ND4 thereof have an identical logic level. Therefore, in order to prevent occurrence of a soft error in the DICE circuit 10, it is necessary to dispose the transistors constituting the connection node ND1 and the transistors constituting the connection node ND3 in different well regions and dispose the transistors constituting the connection node ND2 and the transistors constituting the connection node ND4 in different well regions.

In general, a soft error occurs when electrons or holes generated inside a semiconductor substrate due to radiation incident to the semiconductor substrate are gathered to the drains of transistors. However, such holes have low mobility. Therefore, there is an extremely low possibility that PMOS transistors cause soft errors. For this reason, even if the PMOS transistors whose drains are connected to the connection nodes are disposed without particular restrictions, the soft error tolerance hardly decreases.

Figure 2:
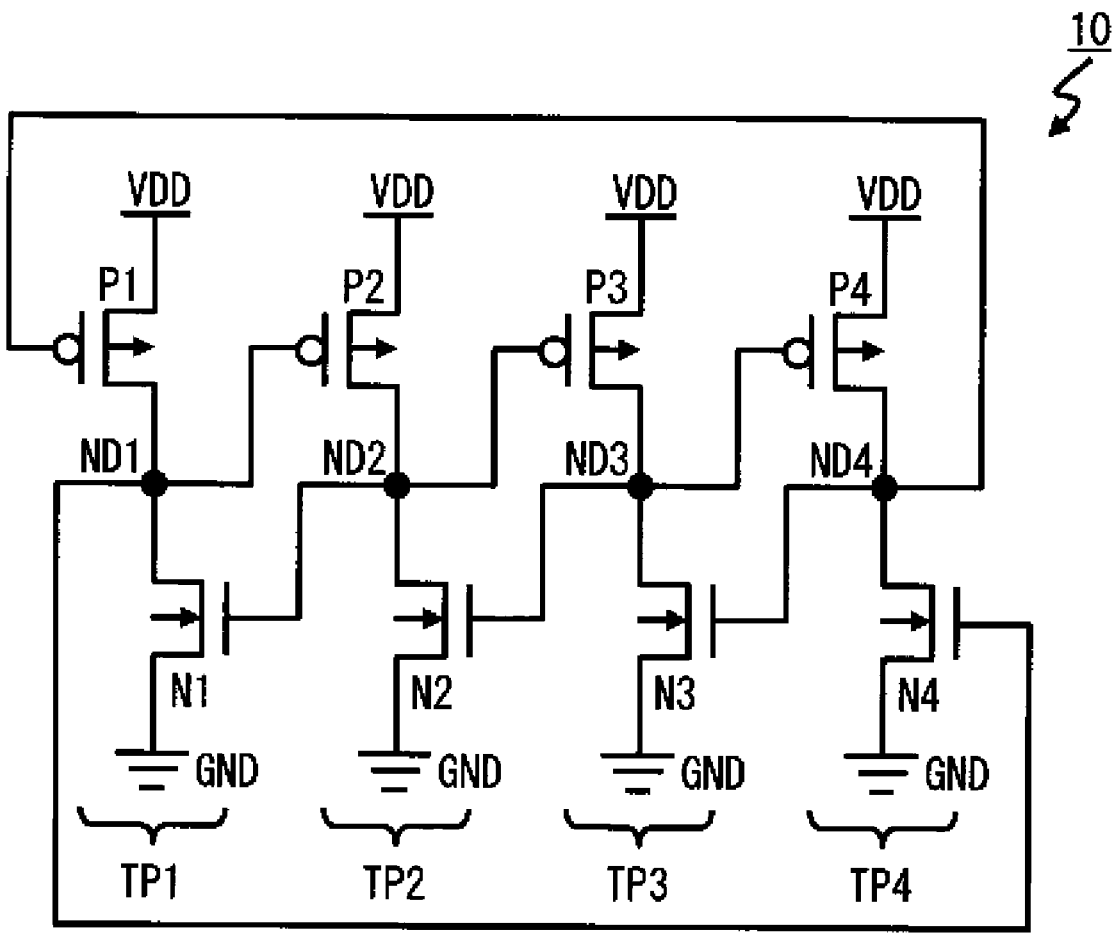
FIG. 2 is a block diagram of a DICE circuit in accordance with the first exemplary embodiment of the present invention.

For this reason, in this exemplary embodiment, only the NMOS transistors whose drains are connected to the connection nodes are disposed in the different well regions. Also, in this exemplary embodiment, the PMOS transistors are disposed in an identical well region in order to increase the layout area efficiency. FIG. 2 shows a circuit diagram where only transistors and nodes necessary to hold the state in the DICE circuit 10 are extracted. The DICE circuit 10 shown in FIG. 2 is substantially the same as the circuit shown in FIG. 1 and therefore will not be described.

Figure 3:
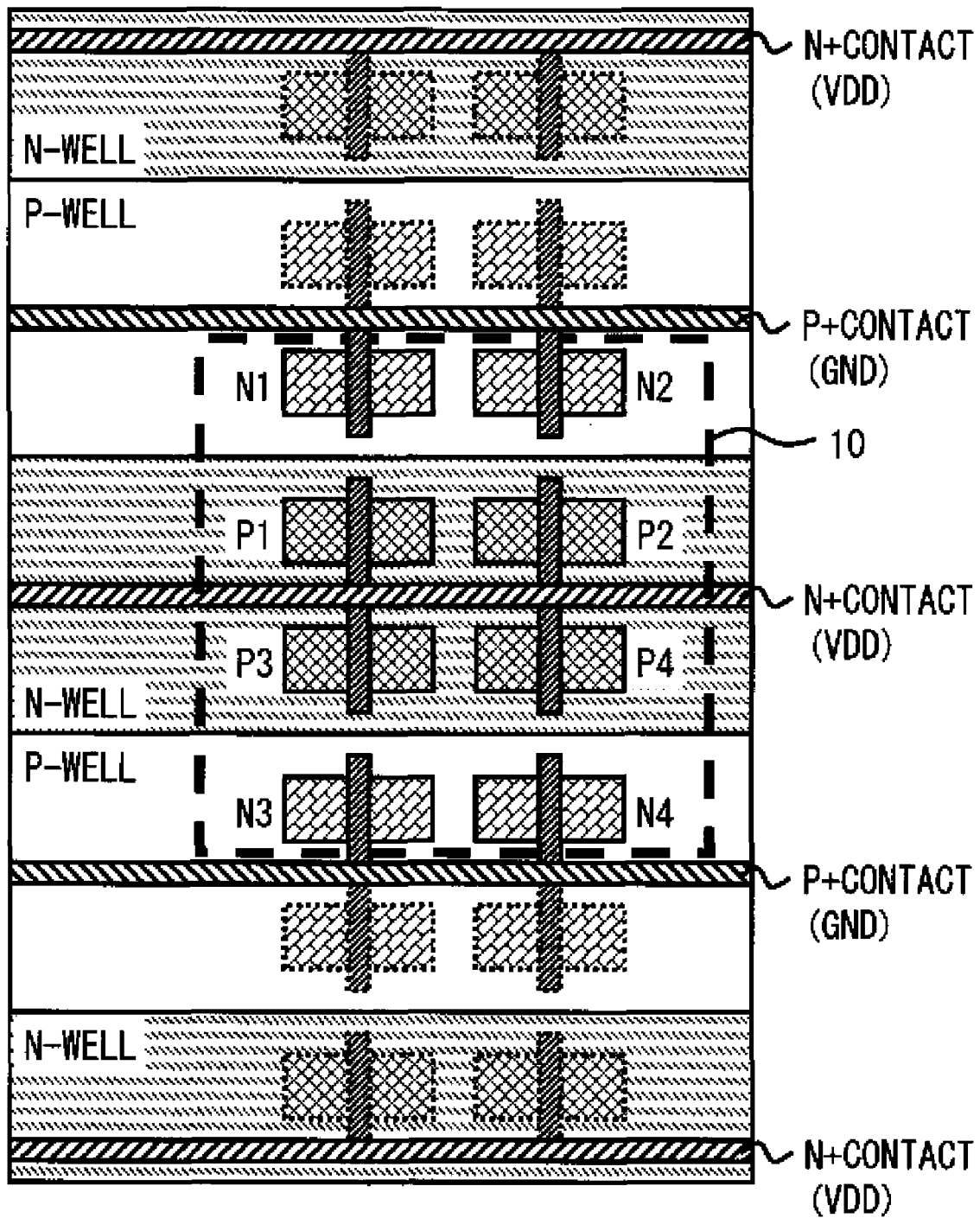
FIG. 3 is a schematic diagram of the layout of the DICE circuit in accordance with a first exemplary embodiment of the present invention.

FIG. 3 is a schematic diagram of the layout of the DICE circuit 10 corresponding to the circuit diagram shown in FIG. 2. In the DICE circuit 10 according to this exemplary embodiment, the elements are disposed in accordance with so-called "standard cell-type" layout where elements are disposed in predetermined well regions. In a standard cell, continuous regions including p-well regions and n-well regions are used as one layout unit. As shown in FIG. 3, the semiconductor device according to this exemplary embodiment includes predetermined well regions, and the n-well regions and p-well regions are alternately disposed.

In each n-well region, an n+contact region is disposed roughly in the center in the direction of the short sides thereof. Also, in each n-well region, PMOS transistors are disposed on both sides of the N+contact. The n+contact region is connected to a power supply terminal VDD. In each p-well region, a p+contact region is disposed roughly in the center in the direction of the short sides thereof. Also, in each p-well region, NMOS transistors are disposed on both sides of the p+contact. The p+contact region is connected to a ground terminal GND.

The DICE circuit 10 is disposed in an area surrounded by a broken line in FIG. 3. Transistors shown in an area other than the area surrounded by the broken line in FIG. 3 are used by circuits other than the DICE circuit 10. As shown in FIG. 3, in the DICE circuit 10, the transistors are disposed using a first p-well region, a second p-well region, and an n-well region. Disposed in the first p-well region are the NMOS transistor N1 of the transistor pair TP1 and the NMOS transistor N2 of the transistor pair TP2. Disposed in the second p-well region are the NMOS transistor N3 of the transistor pair TP3 and the NMOS transistor N4 of the transistor pair TP4. That is, the NMOS transistors are disposed in the first and second p-well regions so that the NMOS transistors whose drains are connected to the connection nodes holding an identical logic level are not contained in an identical p-well region. More specifically, two NMOS transistors that are included in two transistor pairs and whose gates are connected to each other using an inter-node wiring line connected to one connection node are separately disposed in the first p-well region and second p-well region.

On the other hand, in the n-well region according to this exemplary embodiment, the PMOS transistors P1 to P4 of the transistor pairs TP1 to TP4 are disposed. That is, the PMOS transistors are disposed in the n-well region regardless of what logic level is held by each connection node. Note that if the positions of the PMOS transistors in the n-well region are determined so that a PMOS transistor and an NMOS transistor whose drains are connected to each other are opposed to each other, the layout efficiency is increased.

The related-art DICE circuit described in WO/2006/016403 requires at least two n-well regions in order to dispose PMOS transistors. By contrast, in the DICE circuit 10 according to this exemplary embodiment, the PMOS transistors are laid out in one n-well region by eliminating the restriction on the layout of PMOS transistors. More specifically, in the DICE circuit 10 according to this exemplary embodiment, the NMOS transistors connected to the connection nodes holding an identical logic level among the NMOS transistors that are highly likely to cause soft errors are disposed in the different p-well regions. On the other hand, the PMOS transistors that are less likely to cause soft errors are disposed in the identical n-well region regardless of what logic level is held by each connection node. Thus, in the DICE circuit 10 according to this exemplary embodiment, the transistors are disposed in the single n-well region and two p-well regions. That is, the number of required n-well regions in the DICE circuit according to this exemplary embodiment is smaller than that in the related-art DICE circuit described in WO/2006/016403. Thus, a circuit having a less layout area and higher soft error tolerance is realized.

Particularly in standard cell-type layout, well regions are disposed in a fixed manner; therefore, the layout area is further increased due to an increase in the number of n-well regions. However, by adopting the layout method according to this exemplary embodiment when laying out the DICE circuit 10 in accordance with standard cell-type layout, the layout area efficiency is further increased.

In the latch circuit 1 described above, the NMOS transistor included in the connection node ND1 and the NMOS transistor included in the connection node ND3 are disposed in the different p-well regions, and the NMOS transistor constituting the connection node ND2 and the NMOS transistor constituting the connection node ND4 are disposed in the different p-well regions. This prevents simultaneous logic inversion of the connection node ND1 and connection node ND3 holding an identical logic level, of the DICE circuit 10, as well as prevents simultaneous logic inversion of the connection node ND2 and connection node ND4 holding an identical logic level. That is, the DICE circuit 10 according to this exemplary embodiment realizes soft error tolerance higher than that of a typical DICE circuit on which no particular layout restriction is imposed.

Second Exemplary Embodiment

Figure 4:
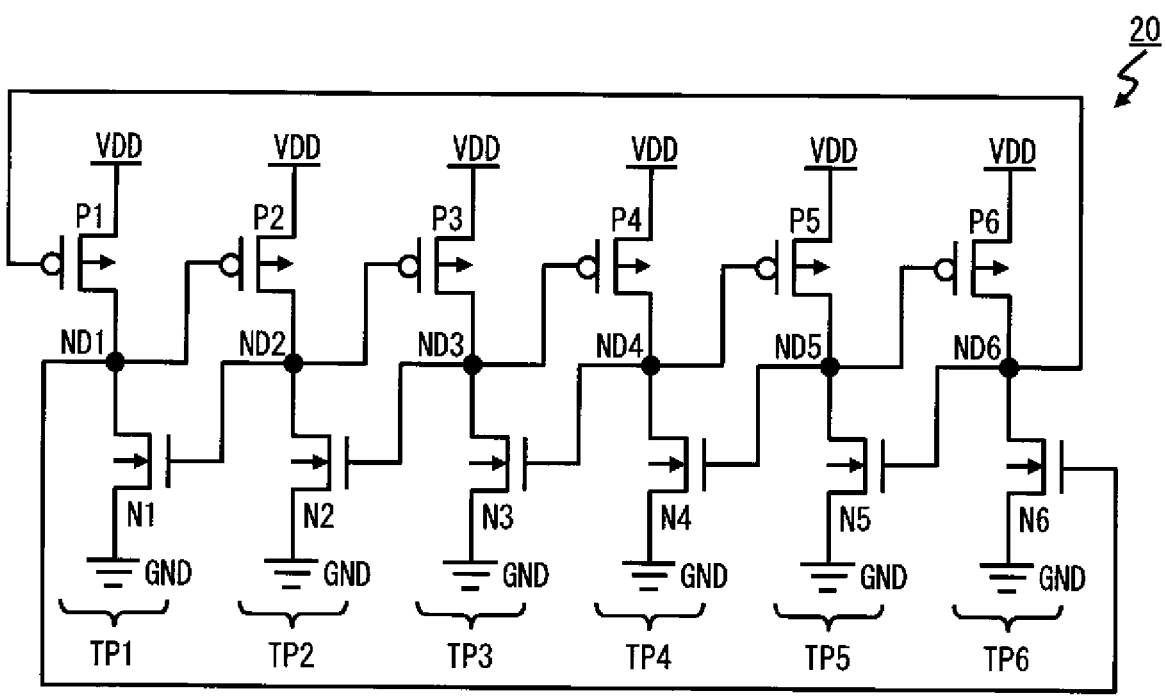
FIG. 4 is a block diagram of a expanded DICE circuit in accordance with a second exemplary embodiment of the present invention.

FIG. 4 shows a circuit diagram of a latch circuit 20 according to a second exemplary embodiment of the present invention. A state storage circuit 20 shown in FIG. 4 is a modification of the DICE circuit 10 shown in FIG. 2 and will be here at the subsequent stage of referred to as an "expanded DICE circuit 20." The expanded DICE circuit 20 includes six transistor pairs (e.g., transistor pairs TP1 to TP6). The transistor pairs TP5 and TP6 are disposed at the subsequent stage of the transistor pair TP4. For this reason, in the expanded DICE circuit 20, the transistor pair TP1 and transistor pair TP4 are connected to one another via the transistor pairs TP5 and TP6.

The transistor pair TP5 includes an NMOS transistor N5, and a PMOS transistor P5. The drain of the PMOS transistor P5 is connected to a power supply terminal VDD, and the source thereof is connected to the drain of the NMOS transistor N5. The gate of the PMOS transistor P5 is connected to the connection node ND4 of the transistor pair TP4 disposed at the preceding stage of the transistor pair TP5 and to the gate of the NMOS transistor N3 of the transistor pair TP3 disposed at the preceding stage of the transistor pair TP4 using an inter-gate wiring line. The source of the NMOS transistor N5 is connected to a ground terminal GND. The gate of the NMOS transistor N5 is connected to a connection node ND6 of the transistor pair TP6 disposed at the subsequent stage of the transistor pair TP5 and to the gate of the PMOS transistor P1 of the transistor pair TP1 disposed at the subsequent stage of the transistor pair TP6 using an inter-gate wiring line. The transistor pair TP5 is used to make the transistor pairs TP1 and TP3 redundant.

The transistor pair TP6 includes an NMOS transistor N6, and a PMOS transistor P6. The drain of the PMOS transistor P6 is connected to a power supply terminal VDD, and the source thereof is connected to the drain of the NMOS transistor N6. The gate of the PMOS transistor P6 is connected to the connection node ND5 of the transistor pair TP5 disposed at the preceding stage of the transistor pair TP6 and to the gate of the NMOS transistor N4 of the transistor pair TP4 disposed at the preceding stage of the transistor pair TP5 using an inter-gate wiring line. The source of the NMOS transistor N6 is connected to a ground terminal GND. The gate of the NMOS transistor N6 is connected to the connection node ND1 of the transistor pair TP1 disposed at the subsequent stage of the transistor pair TP6 and to the gate of the PMOS transistor P2 of the transistor pair TP2 disposed at the subsequent stage of the transistor pair TP1 using an inter-gate wiring line. The transistor pair TP6 is used to make the transistor pairs TP2 and TP4 redundant.

Figure 5:
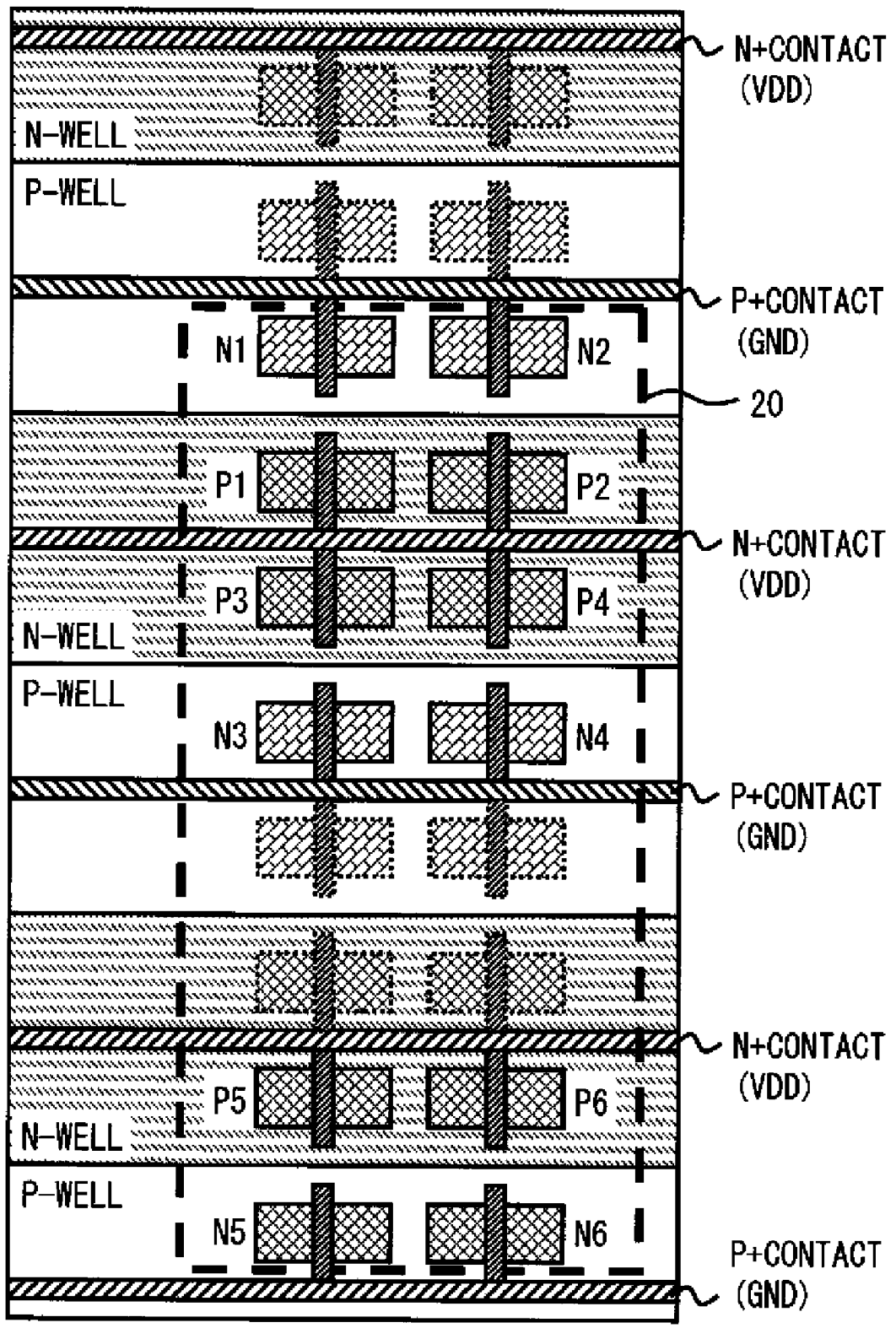
FIG. 5 is a schematic diagram of the layout of the expanded DICE circuit in accordance with the second exemplary embodiment of the present invention.

FIG. 5 shows a schematic diagram of the layout of the expanded DICE circuit 20. As shown in FIG. 5, the expanded DICE circuit 20 is disposed in an area surrounded by a broken line in FIG. 5. In the expanded DICE circuit 20, the connection nodes ND1, ND3, and ND5 have an identical logic level, and the connection nodes ND2, ND4, and ND6 have an identical logic level. For this reason, in the layout of the state storage circuit 20, the NMOS transistors N1, N3, and N5 are disposed in different p-well regions. Also, in the layout of the expanded DICE circuit 20, the NMOS transistors N2, N4, and N6 are disposed in different p-well regions. Therefore, the expanded DICE circuit 20 uses three p-well regions. If the expanded DICE circuit 20 uses three p-well regions in standard cell-type layout, it contains two n-wells.

The PMOS transistor P1 to P6 may be disposed in any of the n-well regions; however, in this exemplary embodiment, the PMOS transistors P1 to P6 are disposed separately in the two n-well regions in consideration of wiring properties. More specifically, the PMOS transistor P1 to P4 are disposed in a first n-well region interposed between a first p-well region in which the NMOS transistors N1 and N2 are disposed and a second p-well region in which the NMOS transistors N3 and N4 are disposed. Also, the PMOS transistor P5 and P6 are disposed in a second n-well region interposed between a third p-well region in which the NMOS transistors N5 and N6 are disposed and the second p-well region.

As is understood from the above description, the expanded DICE circuit 20 including the increased transistor pairs also realizes layout having a high degree of flexibility corresponding to the restriction on the layout of the NMOS transistors by eliminating the restriction on the layout of the PMOS transistors. Also, since the expanded DICE circuit 20 has a high degree of flexibility in layout, a layout area reduction effect similar to that of the first exemplary embodiment is obtained.

Third Exemplary Embodiment

Figure 6:
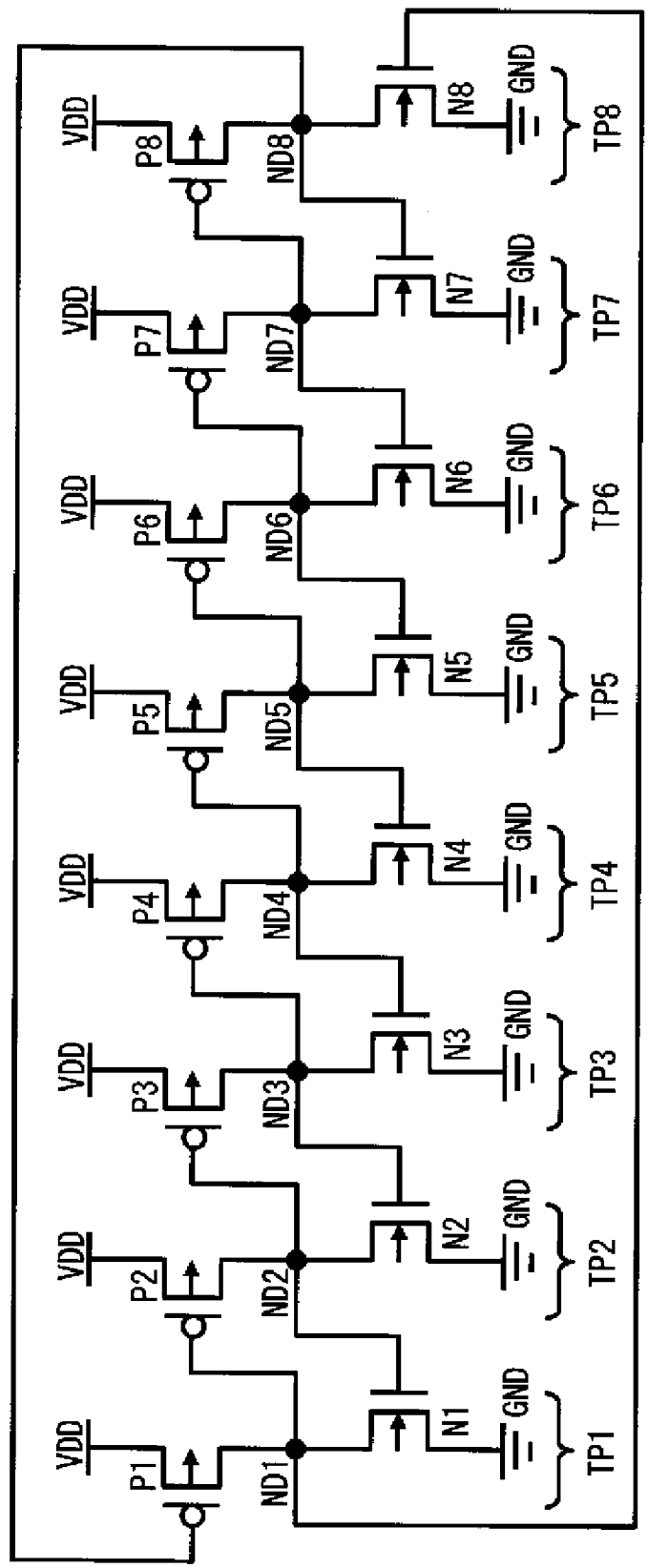
FIG. 6 is a block diagram of a expanded DICE circuit in accordance with a third exemplary embodiment of the present invention.

FIG. 6 shows a circuit diagram of a state storage circuit 30 according to a third exemplary embodiment of the present invention. The state storage circuit 30 shown in FIG. 6 is a modification of the DICE circuit 10 shown in FIG. 2 and will be here at the subsequent stage of referred to as an "expanded DICE circuit 30." The expanded DICE circuit 30 includes eight transistor pairs (e.g., transistor pairs TP1 to TP8). The transistor pairs TP7 and TP8 are disposed at the subsequent stage of the transistor pair TP6. Therefore, in the expanded DICE circuit 30, the transistor pair TP1 and transistor pair TP6 are connected to one another via the transistor pairs TP7 and TP8.

The transistor pair TP7 includes an NMOS transistor N7 and a PMOS transistor P7. The drain of the PMOS transistor P7 is connected to a power supply terminal VDD, and the source thereof is connected to the drain of the NMOS transistor N7. The gate of the PMOS transistor P7 is connected to the connection node ND6 of the transistor pair TP6 disposed at the preceding stage of the transistor pair TP7 and to the gate of the NMOS transistor N5 of the transistor pair TP5 disposed at the preceding stage of the transistor pair TP6 using an inter-gate wiring line. The source of the NMOS transistor N7 is connected to a ground terminal GND. The gate of the NMOS transistor N7 is connected to a connection node ND8 of the transistor pair TP8 disposed at the subsequent stage of the transistor pair TP7 and to the gate of the PMOS transistor P1 of the transistor pair TP1 disposed at the subsequent stage of the transistor pair TP8 via an inter-gate wiring line. The transistor pair TP7 is used to make the transistor pairs TP1, TP3, and TP5 redundant.

The transistor pair TP8 includes an NMOS transistor N8 and a PMOS transistor P8. The drain of the PMOS transistor P8 is connected to a power supply terminal VDD, and the source thereof is connected to the drain of the NMOS transistor N8. The gate of the PMOS transistor P8 is connected to the connection node ND7 of the transistor pair TP7 disposed at the preceding stage of the transistor pair TP8 and to the gate of the NMOS transistor N6 of the transistor pair TP6 disposed at the preceding stage of the transistor pair TP7 using an inter-gate wiring line. The source of the NMOS transistor N8 is connected to a ground terminal GND. The gate of the NMOS transistor N8 is connected to the connection node ND1 of the transistor pair TP1 disposed at the subsequent stage of the transistor pair TP8 and to the gate of the PMOS transistor P2 of the transistor pair TP2 disposed at the subsequent stage of the transistor pair TP1 using an inter-gate wiring line. The transistor pair TP8 is used to make the transistor pairs TP2, TP4, and TP6 redundant.

Figure 7:
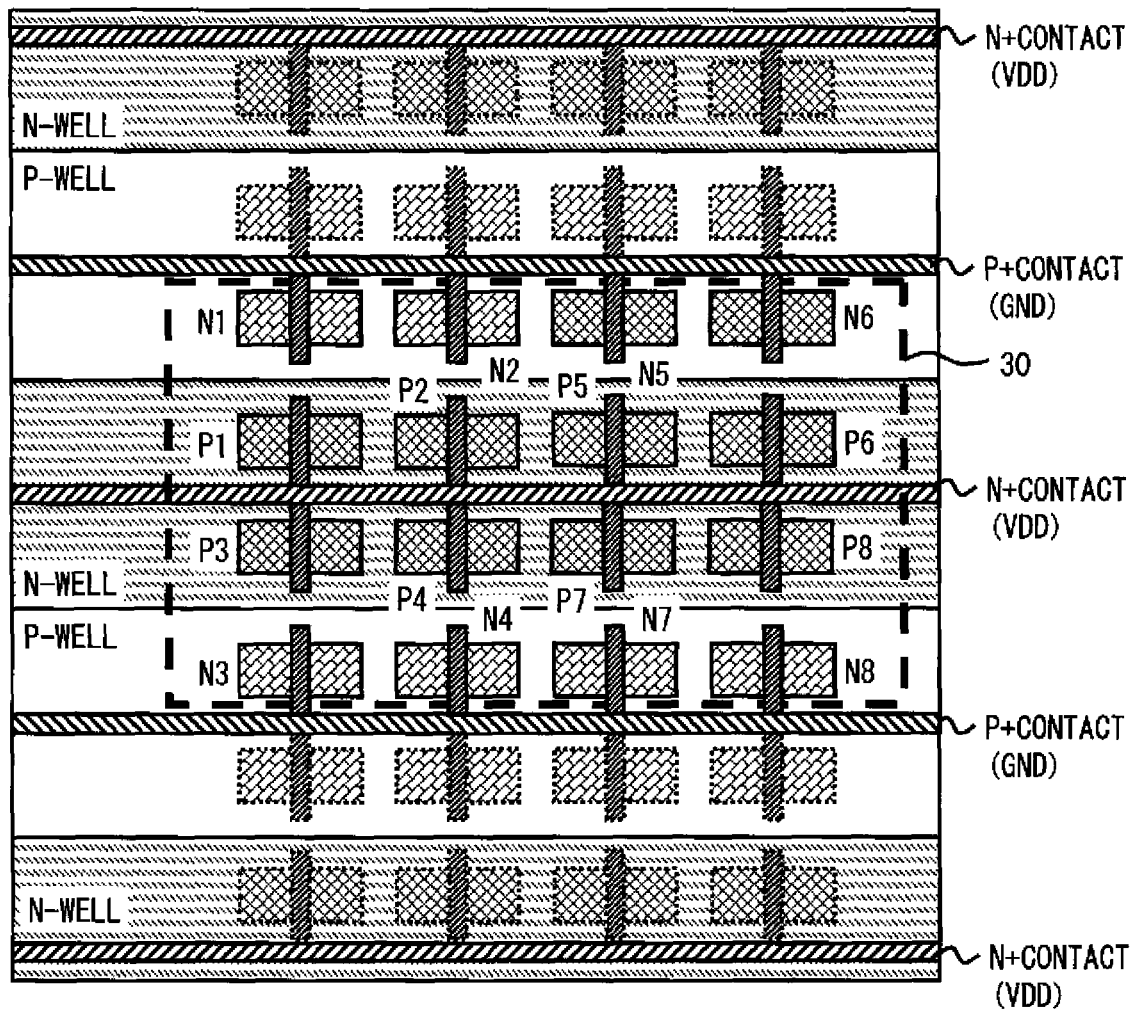
FIG. 7 is a schematic diagram of the layout of the expanded DICE circuit in accordance with the third exemplary embodiment of the present invention.
Figure 8:
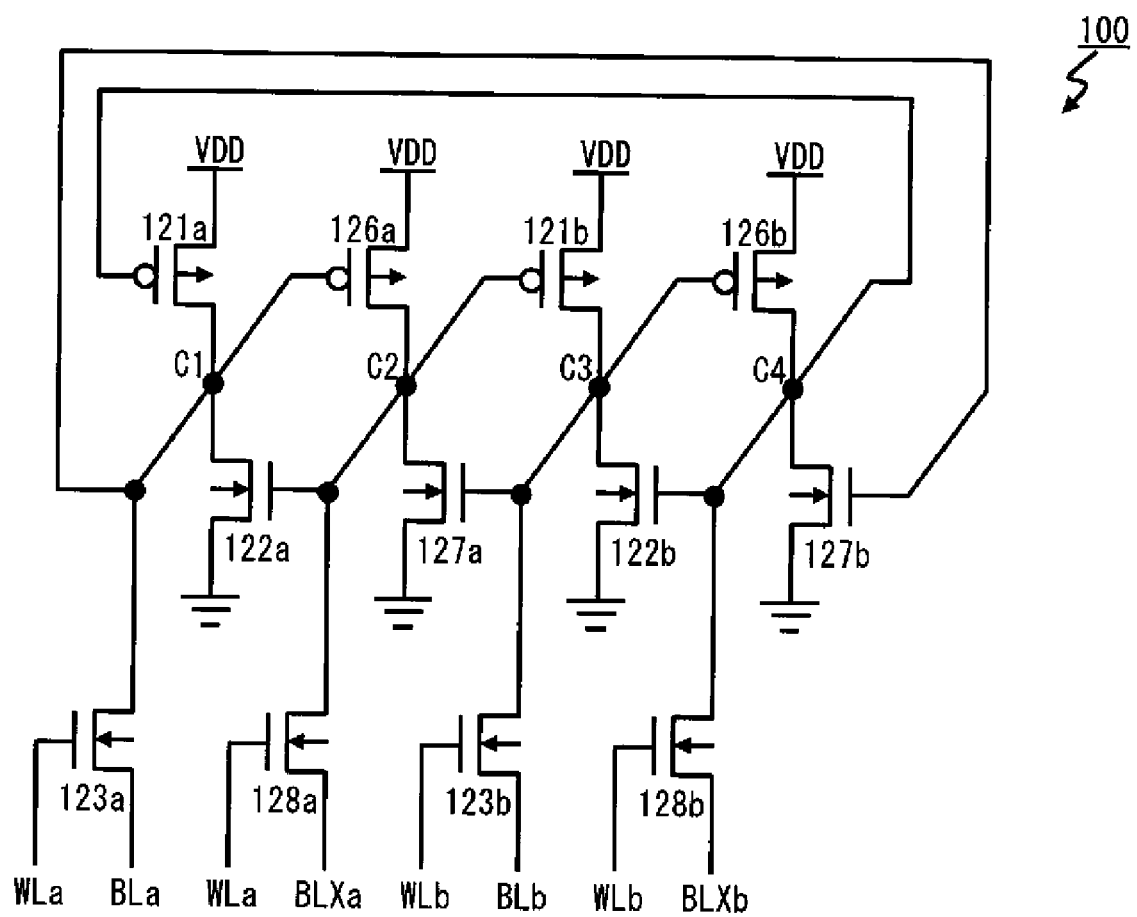
FIG. 8 is a block diagram of a DICE circuit in accordance with a prior art.
Figure 9:
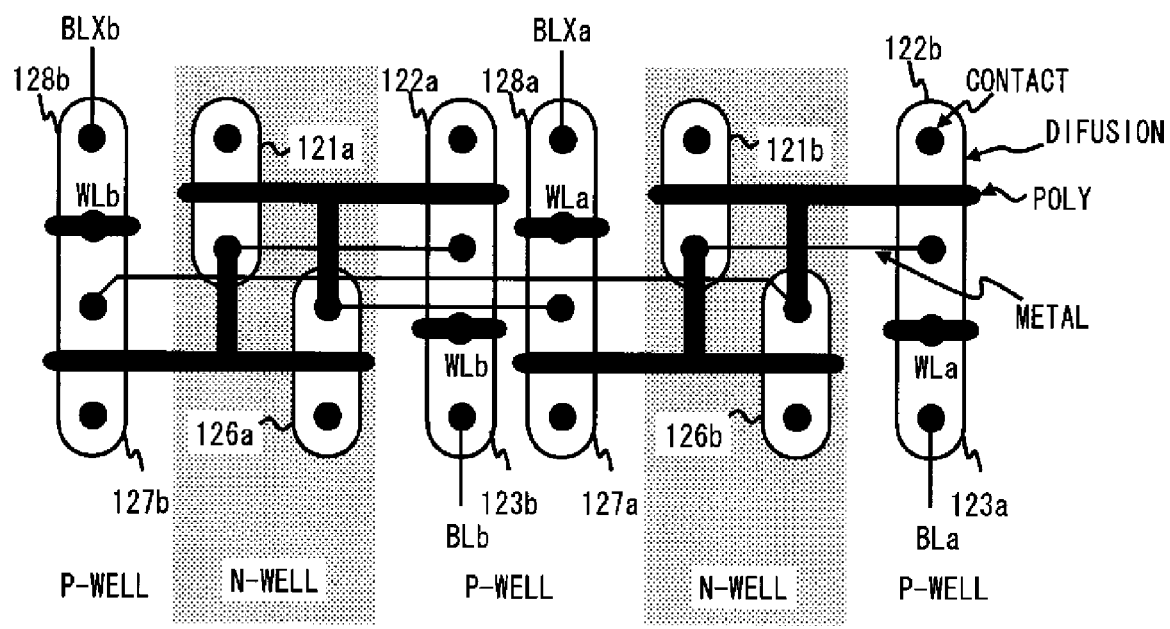
FIG. 9 is a schematic diagram of the layout of the DICE circuit in accordance with the prior art.

FIG. 7 shows a schematic diagram of the layout of the expanded DICE circuit 30. As shown in FIG. 7, the expanded DICE circuit 30 is disposed in an area surrounded by a broken line in FIG. 7. In the DICE circuit 30, the connection nodes ND1, ND3, ND5, and ND7 have an identical logic level and the connection nodes ND2, ND4, ND6, and ND8 have an identical logic level. However, if attention is paid, for example, to the transistor pair TP3, the transistor pair TP7 has no transistor directly connected to any transistor of the transistor pair TP3 via an inter-gate wiring line. For this reason, in the layout of the expanded DICE circuit 30, the NMOS transistors N1 and N5 are disposed in an identical p-well region, the NMOS transistors N3 and N7 are disposed in an identical p-well region, and the combination of the NMOS transistors N1 and N5 and the combination of the NMOS transistors N3 and N7 are disposed in the different p-well regions. Also, in the layout of the expanded DICE circuit 30, the NMOS transistors N2 and N6 are disposed in an identical p-well region, the NMOS transistors N4 and N8 are disposed in an identical p-well region, and the combination of the NMOS transistors N2 and N6 and the combination of the NMOS transistors N4 and N8 are disposed in the different p-well regions. Therefore, the expanded DICE circuit 30 uses the two p-well regions. If the expanded DICE circuit 30 uses the two p-well regions in standard cell-type layout, it contains one n-well.

Therefore, the PMOS transistors P1 to P8 are all disposed in the one n-well region.

As is understood from the above description, in the expanded DICE circuit 30 including the increased transistor pairs, the transistors are disposed in a layout area having a height lower than that of the expanded DICE circuit 20 and equal to that of the DICE circuit 10. Since the expanded DICE circuit 30 has more redundancy than the DICE circuit 10 and expanded DICE circuit 20, it has soft error tolerance higher than the DICE circuit 10 and expanded DICE circuit 20. The expanded DICE circuit 30 also realizes layout having a high degree of flexibility corresponding to the restriction on the layout of the NMOS transistors by eliminating the restriction on the layout of the PMOS transistors. Also, since the expanded DICE circuit 30 has a high degree of flexibility in layout, a layout area reduction effect similar to those of the first and second exemplary embodiments is obtained.

The first and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

For example, the degree of redundancy of the transistor pairs is a design matter and can be changed depending on the use.

What is claimed is:

1. A semiconductor device comprising:
an even number of transistor pairs, each transistor pair being a transistor pair in which an n-type transistor and a p-type transistor are connected in series between a power supply terminal and a ground terminal, the even number being a four or more;
connection nodes connecting the n-type transistors and the p-type transistors of the transistor pairs; and
inter-gate wiring lines connected to the connection nodes, each inter-gate wiring line connecting a gate of the n-type transistor of one of the transistor pairs disposed in the preceding stage of one of the transistor pairs for which each connection node is provided and a gate of the p-type transistor of one of the transistor pairs disposed in the subsequent stage of one of the transistor pairs for which each connection node is provided, wherein
the even number of transistor pairs constitute a state storage circuit in such a manner that the transistor pairs are connected in the form of a loop, and
any one of the transistor pairs is referred to as a first transistor pair, the n-type transistor of the first transistor pair is disposed in a p-well region different from both a p-well region in which the n-type transistor of a second transistor pair disposed in two stages preceding of the first transistor pair is disposed and a p-well region in which the n-type transistor of a third transistor pair disposed in two stages subsequent of the first transistor pair is disposed.

2. The semiconductor device according to claim 1, wherein the p-well region in which the n-type transistor of the first transistor pair is disposed is one of a plurality of p-well regions defined by at least one n-well region, the n-well region being an n-well region in which the p-type transistors are disposed.

3. The semiconductor device according to claim 1, wherein the semiconductor device comprises the four transistor pairs, and
the four n-type transistors of the transistor pairs are disposed in two p-well regions including the p-well region in which the n-type transistor of the first transistor pair is disposed.

4. The semiconductor device according to claim 3, wherein the p-well region in which the n-type transistor of the first transistor pair is disposed is one of two p-well regions defined by one n-well region, and
the four p-type transistors of the transistor pairs are disposed in the n-well region.

5. The semiconductor device according to claim 1, wherein the semiconductor device comprises the six transistor pairs, and
the six n-type transistors of the transistor pairs are disposed in three p-well regions including the p-well region in which the n-type transistor of the first transistor pair is disposed.

6. The semiconductor device according to claim 5, wherein three p-well regions including the p-well region in which the n-type transistor of the first transistor pair is disposed are defined by two n-well regions, and
the six p-type transistors of the transistor pairs are arbitrarily disposed in the two n-well regions.

7. The semiconductor device according to claim 1, wherein the semiconductor device comprises the eight transistor pairs, and
the eight n-type transistors of the transistor pairs are disposed in two p-well regions including the p-well region in which the n-type transistor of the first transistor pair is disposed.

8. The semiconductor device according to claim 7, wherein two p-well regions including the p-well region in which the n-type transistor of the first transistor pair is disposed are defined by one n-well region, and
the eight p-type transistors of the transistor pairs are disposed in the n-well region.

9. The semiconductor device according to claim 1, wherein p-well regions including the p-well region in which the n-type transistor of the first transistor pair is disposed and an n-well region are fixed regions whose disposition is previously determined, and
the semiconductor device is configured as a standard cell where the n-type transistors and the p-type transistors constituting the state storage circuit are disposed in the fixed regions.

* * * * *